US012665358B2

(12) United States Patent
Shu et al.

(10) Patent No.: US 12,665,358 B2
(45) Date of Patent: Jun. 23, 2026

(54) POWER BANK

(71) Applicant: Anker Innovations Technology Co., Ltd., Changsha (CN)

(72) Inventors: Fangwu Shu, Shenzhen (CN); Jianjun Huang, Shenzhen (CN); Yijin Qiu, Changsha (CN); Jianfeng Zhou, Shenzhen (CN); Qianer Xu, Shenzhen (CN)

(73) Assignee: Anker Innovations Technology Co., Ltd., Changsha (CN)

( * ) Notice: Subject to any disclaimer, the term of this patent is extended or adjusted under 35 U.S.C. 154(b) by 0 days.

(21) Appl. No.: 19/343,062

(22) Filed: Sep. 29, 2025

(65) Prior Publication Data

US 2026/0095004 A1 Apr. 2, 2026

(30) Foreign Application Priority Data

Sep. 27, 2024 (CN) .......................... 202422383635.6
Oct. 23, 2024 (CN) .......................... 202422569863.2

(51) Int. Cl.
*H01R 13/72* (2006.01)
*H01R 31/06* (2006.01)
*H02G 11/02* (2006.01)
*H05K 5/02* (2006.01)

(52) U.S. Cl.
CPC ............. *H01R 13/72* (2013.01); *H01R 31/06* (2013.01); *H02G 11/02* (2013.01); *H05K 5/0247* (2013.01)

(58) Field of Classification Search
CPC ........ H01R 13/72; H01R 31/06; H02G 11/02; H05K 5/0247
See application file for complete search history.

(56) References Cited

U.S. PATENT DOCUMENTS

| | | | |
|---|---|---|---|
| 11,658,448 B2 * | 5/2023 | Ruan ...................... | H01R 35/04 |
| | | | 439/11 |
| 2009/0156034 A1 * | 6/2009 | Araki ................... | H01R 35/025 |
| | | | 439/164 |
| 2010/0151723 A1 * | 6/2010 | Su .......................... | H01R 31/06 |
| | | | 439/505 |
| 2010/0151727 A1 * | 6/2010 | Luo .................... | H01R 12/7047 |
| | | | 439/544 |
| 2023/0024575 A1 * | 1/2023 | Ruan ...................... | H01R 13/72 |

FOREIGN PATENT DOCUMENTS

| | | | |
|---|---|---|---|
| CN | 209401950 U | | 9/2019 |
| CN | 211606165 U | | 9/2020 |
| CN | 213782934 U | | 7/2021 |
| CN | 216451156 U | * | 5/2022 |

* cited by examiner

*Primary Examiner* — Abdullah A Riyami
*Assistant Examiner* — Nader J Alhawamdeh
(74) *Attorney, Agent, or Firm* — Banner & Witcoff, Ltd.

(57) ABSTRACT

A charging device comprises a housing having an accommodating cavity, and a retractable charging cable at least partially located within the accommodating cavity. The charging device comprises a second charging cable having a first end extending into the accommodating cavity and a second end located outside the accommodating cavity. The charging device also comprises a connector electrically connected to the second end of the second charging cable; and a fixing portion disposed on the second charging cable. The connector is configured to pass through the fixing portion. The second charging cable, the connector, and the fixing portion together form a closed loop.

20 Claims, 11 Drawing Sheets

1

30

12

44

50

61(60)

11

X

44

41
42

51a(51)

POWER BANK

CROSS-REFERENCE TO RELATED APPLICATIONS

The present disclosure claims priority to CN application No. 202422383635.6, filed on Sep. 27, 2024, and CN application No. 202422569863.2, filed on Oct. 23, 2024. Each of the above applications is hereby incorporated in its entirety.

FIELD

The present disclosure relates to the technical field of charging equipment, particularly to a charging device (e.g., a portable power supply such as a power bank).

BACKGROUND

With the increasingly frequent use of portable electronic devices in daily life and work—such as mobile phones, iPads, laptops, handheld game consoles, and so on—the number of charging devices for these portable electronics is also growing. To maintain a tidy desktop, many related technologies have developed mobile power products that can retract and store charging cables. However, because the charging cables in these products are frequently extended and retracted, the connection between the cables and the internal circuit board of the charging device can easily become unstable.

Further, with the popularity of mobile devices and the increasing demand for portability, application scenarios of high-power portable power banks are expanding. Based on the demands of high energy density and high output power, power densities of heating elements inside the high-power portable power banks continue to increase. The heating elements can generate a large amount of heat during efficient operations, which makes surface temperatures of housings rise, and local hot spots may be formed, which seriously affects the user experience and product safety.

At present, potting processes are widely used in the industry to manage the heat of the portable power banks, and potting materials are used to achieve thermal equalization and dissipation of the heating elements, to reduce the overall temperatures of the portable power banks. However, potting materials increase the overall weights of the portable power banks, which is not conducive to the portability and light-weight of the portable power banks, and the portable power banks are difficult to repair after the potting material is cured, which reduces the maintainability of the power banks. Therefore, there is a need for a thermal management scheme that considers the requirements of maintainability and light-weight.

SUMMARY

The present disclosure describes a charging device (e.g., a power bank) comprising: a housing having an accommodating cavity and a retractable charging cable at least partially located within the accommodating cavity. The charging device may also comprise a second charging cable having a first end extending into the accommodating cavity and a second end located outside the accommodating cavity. The charging device may also comprise a connector electrically connected to the second end of the second charging cable; and a fixing portion disposed on the second charging cable. The connector is configured to pass through the fixing portion, the second charging cable, the connector, and the fixing portion together forming a closed loop. The second charging cable can be used as a handle to hang the charging device. The fixing portion may comprise a through groove having a first opening and a second opening on opposite ends of the through groove, and the fixing through groove may comprise a step structure configured to secure the connector.

Further, the present disclosure describes a charging device comprising a housing having an accommodating cavity, and a battery cell disposed within the accommodating cavity. The charging device may comprise a retractable charging cable at least partially located in the accommodating cavity. In addition, the charging device may comprise a first circuit board disposed within the accommodating cavity; and a second circuit board disposed within the accommodating cavity. The second circuit board may be oriented substantially perpendicular to the first circuit board and facing the battery cell. The charging device may comprise a second charging cable and a connector located outside the accommodating cavity. The first end of the conductive wire may extend into the accommodating cavity and may be electrically connected to at least one of the first circuit board or the second circuit board, and a second end of the second charging cable may be electrically connected to the connector.

In addition, the present disclosure provides a charging device (e.g., a portable charging device) that enables a more stable electrical connection between a movable charging cable (e.g., retractable charging cable) and an internal circuit board.

An example of the present disclosure provides a charging device comprising: a housing having an accommodating cavity; a first circuit assembly connected to the housing and comprising a first circuit board disposed in the accommodating cavity. The first circuit board may comprise a conductive track. The charging device may also comprise a second circuit assembly comprising a charging cable at least partially located in the accommodating cavity; and a cable reel and a conductive member that are disposed in the accommodating cavity. The cable reel may be rotatably connected to the housing. The conductive member may be disposed on the cable reel. The charging cable may be electrically connected to the conductive member and wound around a circumference of the cable reel, and the charging cable is configured to extend from the accommodating cavity and drive the cable reel and the conductive member to rotate relative to the housing. The conductive member may be disposed corresponding to the conductive track and is in electrical contact with the conductive track. The electrical connection between the charging cable and the first circuit assembly can be maintained.

According to the charging device in the example of the present disclosure, the conductive member can be directly disposed on the cable reel, so that the charging cable can be electrically connected to the first circuit board through the conductive member and the conductive track. When the cable reel drives the first circuit board and the conductive member to rotate, the conductive member can move along the conductive track on the first circuit board, thereby always contacting the conductive track and conducting electricity, so that the charging cable can supply power to external electronic devices more stably.

BRIEF DESCRIPTION OF DRAWINGS

In order to more clearly illustrate technical solutions in examples of the disclosure or in the related art, the drawings that need to be used in description of the examples or the related art are briefly introduced below, and it is apparent that the accompanying drawings described below are merely some examples of the present disclosure, and for those of ordinary skill in the art, other drawings can be obtained based on these drawings without inventive work.

Figure 1:
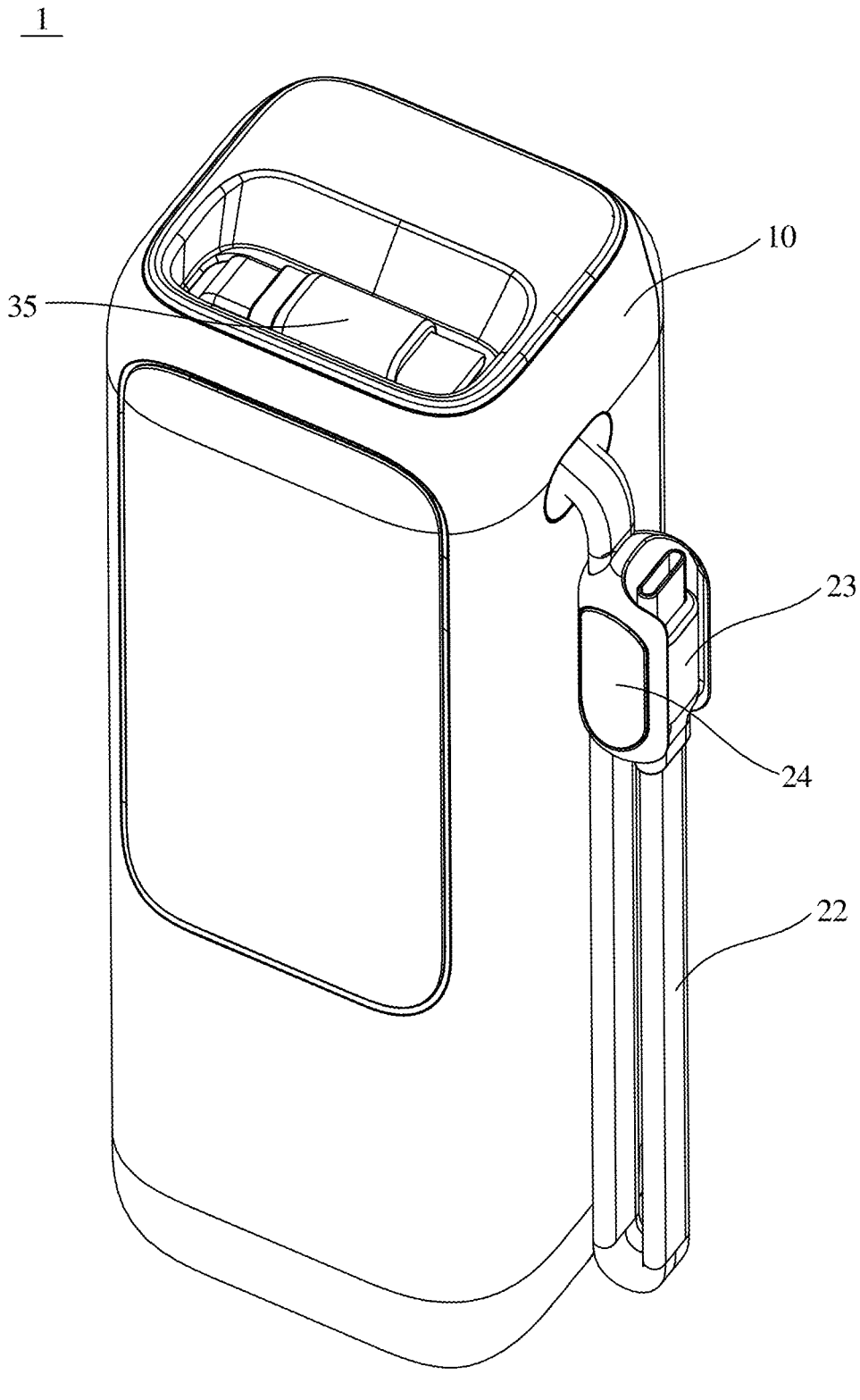
FIG. 1 is a structure diagram of a charging device according to an example of the present disclosure.

Description of reference numerals: 1: charging device; 10:11, bottom shell; 12, top shell; housing; 20: first circuit assembly; 21: first circuit board; 211: conductive track; 22: conductive wire body; 221: first end; 222: main body portion; 223: second end; 23: first connector; 24: fixing portion; 241: fixing through groove; 2411: first opening; 2412: second opening; 2413: third opening; 242: step structure; 30: second circuit assembly; 31: cable reel; 32: charging cable; 33: conductive member; 331: conductive contact; 34: second circuit board; 35: second connector; 36: mounting bracket; 361: mounting recess; 362: first slide groove; 3621: first end portion; 3622: second end portion; 37: coil spring; 38: friction member; 381: protrusion; 40: battery compartment; 50, power supply body; 51, mounting member; 52, circuit board; 53, battery cell; 54, display assembly; 60, thermal conduction member; 61, thermal conduction block; 44, thermal insulation member; 41, thermal equalization layer; 42, thermal insulation layer; 510, battery cell groove; 51*a*, battery cell bracket; 511, bracket body; 512, grid plate; 531, first cell unit; 532, second cell unit; X, first direction; Y, second direction; Z, third direction.

DETAILED DESCRIPTION

In order to describe the technical solutions in the examples of the present disclosure or the related art more clearly, the present disclosure will be described clearly and completely below with reference to the accompanying drawings in the examples of the present disclosure. The described examples are a part, but not all of the examples of the present disclosure. All other examples obtained by those of ordinary skill in the art based on the examples of the present disclosure without inventive work shall belong to the protection scope of the present disclosure.

In the related art, there are many mobile power supply devices in which charging cables can be wound and stored. Since the charging cable often needs to be extended and retracted during use, the connection between the charging cable and the internal circuit board of the mobile power supply device is likely to be unstable, causing unstable voltage output.

Figure 2:
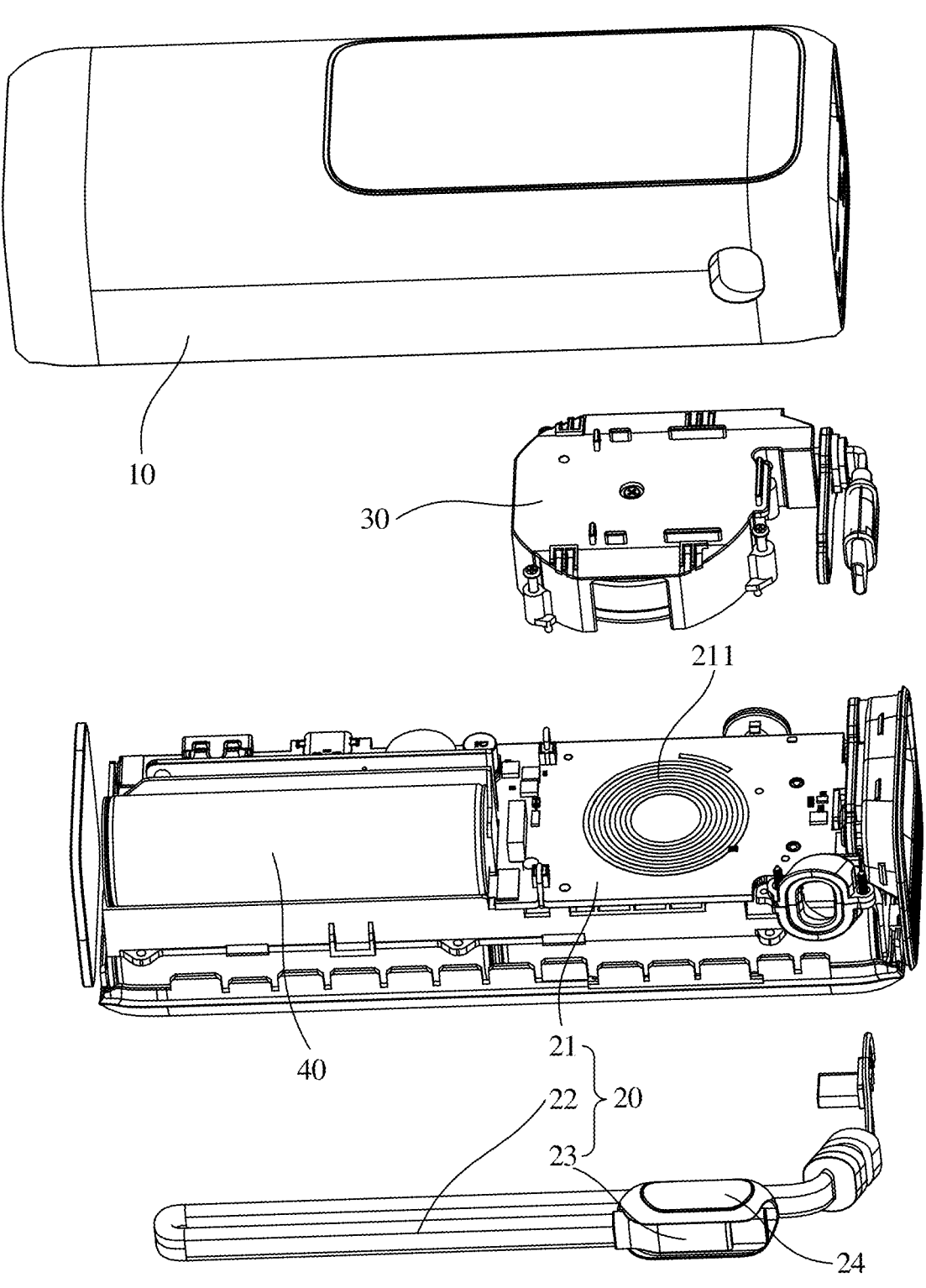
FIG. 2 is an exploded structure diagram of a charging device according to an example of the present disclosure.
Figure 3:
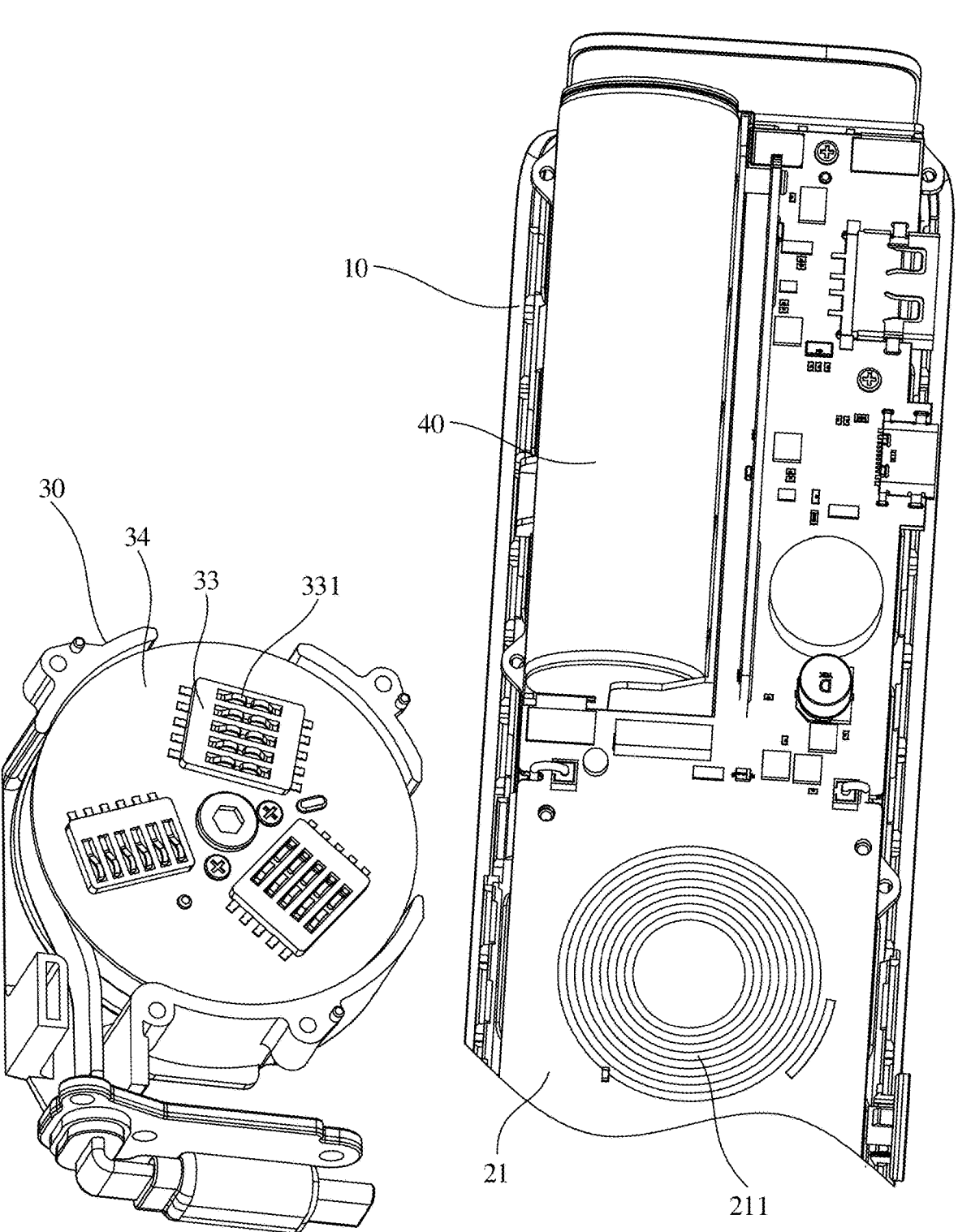
FIG. 3 is a structure diagram of a second circuit assembly and a first circuit assembly that are corresponding to each other according to an example of the present disclosure.

With reference to FIGS. 1 to 3, the present disclosure describes a charging device 1 that includes a housing 10, a first circuit assembly 20, and a second circuit assembly 30. The housing 10 has an accommodating cavity (not shown) in which the first circuit assembly 20 and the second circuit assembly 30 are at least partially located. The first circuit assembly 20 is connected to the housing 10, which can provide a mounting space and a placement base for some structures of the first circuit assembly 20 and the second circuit assembly 30. The charging device 1 may be a portable power supply such as a power bank.

The second circuit assembly 30 may include a cable reel 31, a charging cable 32 and a conductive member 33. The charging cable 32 is at least partially located in the accommodating cavity. The cable reel 31 and the conductive member 33 are disposed in the accommodating cavity. The housing 10 can provide a mounting space and a placement base for the cable reel 31 and the conductive member 33. The cable reel 31 is rotatably connected to the housing 10. The conductive member 33 is disposed on the cable reel 31. The charging cable 32 is electrically connected to the conductive member 33, and is wound along the circumference of the cable reel 31. The cable reel 31 provides a placement base for the charging cable 32. The charging cable 32 is configured to connect to an external electronic device to supply power to the external electronic device. The housing 10 may be provided with an exit hole for the charging cable 32 to extend from the accommodating cavity. A user may pull the charging cable 32 so that the charging cable 32 extends from the accommodating cavity and drives the cable reel 31 and the conductive member 33 to rotate relative to the housing 10.

The first circuit assembly 20 may include a first circuit board 21 disposed in the accommodating cavity. The housing 10 may provide a mounting space and a placement base for the first circuit board 21, thereby facilitating protection of the first circuit board 21. A conductive track 211 is provided on the first circuit board 21. The conductive member 33 is disposed corresponding to the conductive track 211, and may be in electrical contact with the conductive track 211. The charging cable 32 is electrically connected to the first circuit board 21 via the conductive track 211 and the conductive member 33. When the cable reel 31 and the conductive member 33 rotate, the conductive member 33 can move along the conductive track 211 on the first circuit board 21, thereby keeping electrical connection with the conductive track 211 during rotation of the cable reel 31 and the conductive member 33. Accordingly, the charging cable 32 can provide stable power for external electronic devices, improving power supply stability of the charging cable 32. For example, the conductive member 33 may be made of conductive metal and may be one or more metal pins, metal sheets, or metal pads, and the conductive track 211 may be a copper track with good conductive performance.

It should be noted that the second circuit assembly 30 may also include a second circuit board 34 connected to the cable reel 31. The conductive member 33 is disposed on the second circuit board 34. The charging cable 32 is electrically connected to the conductive member 33 through the second circuit board 34. The second circuit board 34 can be electrically connected to the first circuit board 21 through the conductive member 33 and the conductive track 211.

In some examples of the present disclosure, as illustrated in FIG. 2, the conductive track 211 is circular, so that the conductive member 33 may be always in electrical contact with the conductive track 211 during rotation.

Figure 4:
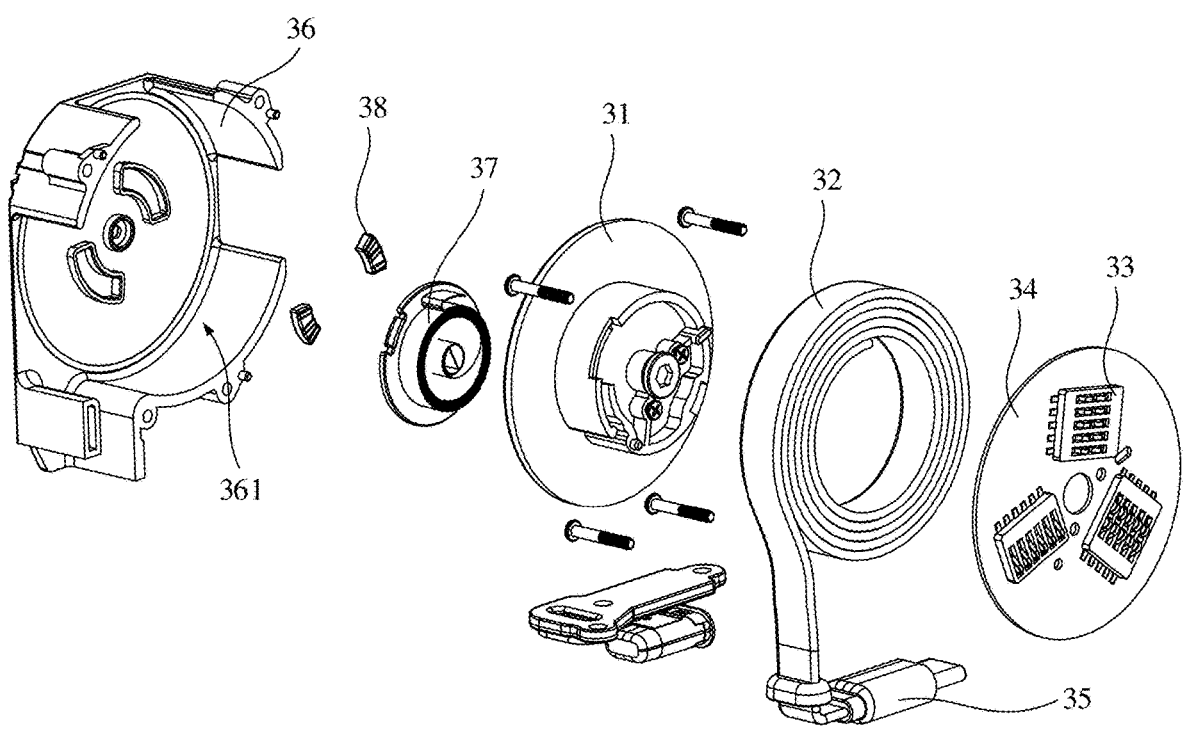
FIG. 4 is an exploded structure diagram of a second circuit assembly according to an example of the present disclosure.

As illustrated in FIGS. 3 and 4, the conductive member 33 includes a plurality of conductive elastic sheets which are arranged at intervals around an axis of the cable reel 31 and are in electrical contact with the conductive track 211. Specifically, a plurality of conductive elastic sheets are provided, which is conducive to improving conduction stability between the conductive elastic sheets and the conductive track 211, and the conductive elastic sheets abut against the conductive track 211, thereby facilitating maintaining contact between the conductive elastic sheets and the conductive track 211.

In some examples, the conductive track 211 may be provided in one turn, and the conductive member 33 slides along the conductive track 211 and conducts electricity during rotation. Alternatively, a plurality of conductive elastic sheets are arranged at intervals around the axis of the cable reel 31, each of which is provided with a plurality of conductive contacts 331. The plurality of conductive contacts 331 may be arranged at intervals along a radial direction of the cable reel 31, and the circular conductive track 211 may be provided in multiple turns. The multiple turns of the conductive track 211 are arranged at intervals along the radial direction of the cable reel 31. Each turn of the conductive track 211 may be in contact with the conductive contact 331, thereby further improving the conduction stability between the conductive elastic sheet and the conductive track 211.

In some examples, as illustrated in FIG. 2, the first circuit assembly 20 may further include a conductive wire body 22 (e.g., a charging cable) and a first connector 23 located outside the accommodating cavity. A first end 221 of the conductive wire body 22 may extend into the accommodating cavity and be electrically connected to the first circuit board 21. A second end 223 of the conductive wire body 22 is located outside the accommodating cavity and is electrically connected to the first connector 23. The second circuit assembly 30 may further include a second connector 35 located outside the accommodating cavity, which is electrically connected to the charging cable 32. The charging device 1 may further include a battery compartment 40 which is electrically connected to the first circuit board 21 and/or the second circuit board 34. When the charging device 1 charges an electronic device such as a mobile phone or a computer, the first connector 23 and/or the second connector 35 can be connected to the external electronic device to supply power to the external electronic device. Additionally or alternatively, the first connector 23 and/or the second connector 35 can be connected to a socket or other power supplies to charge the battery compartment 40 of the charging device 1. Additionally or alternatively, a socket may be provided on the housing 10, so that an external power supply plug can be inserted therein to charge the battery compartment 40 of the charging device 1.

Referring to FIGS. 1 and 2, in some examples of the present disclosure, a fixing portion 24 is provided on the conductive wire body 22, and the first connector 23 is detachably connected to the fixing portion 24 (e.g., a fixing holder, a fixing bracket). Specifically, the first connector 23 can be detachably connected to the fixing portion 24 by locking, bonding, or magnetic attraction. The first connector 23 and the fixing portion 24 can be connected together or separated by disassembly. When the first connector 23 is connected to the fixing portion 24, the first connector 23 passes through the fixing portion 24, and the conductive wire body 22 and the fixing portion 24 together enclose a closed circle.

Figure 5:
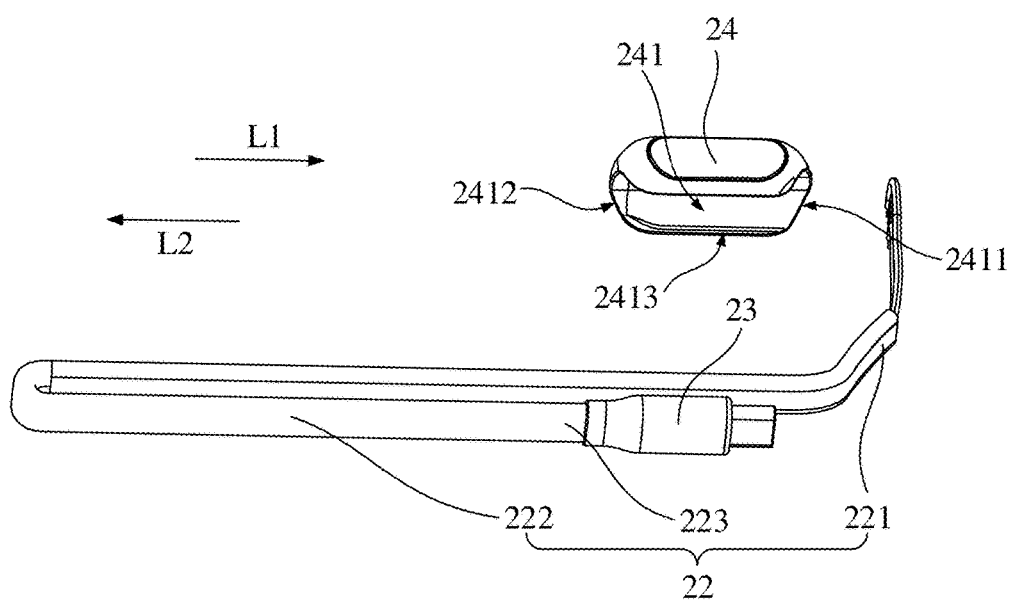
FIG. 5 is a structure diagram of a conductive wire body and a fixing portion according to an example of the present disclosure.

For example, as illustrated in FIG. 5, for example, the conductive wire body 22 includes the first end 221, a main body portion 222, and the second end 223 that are connected in sequence. Since the fixing portion 24 may be disposed close to the first end 221 of the conductive wire body 22 and the first connector 23 is connected to the second end 223 of the conductive wire body 22, when the first connector 23 is connected to the fixing portion 24, the fixing portion 24 may fix (e.g., attach) the second end 223 of the conductive wire body 22 to the first end 221, and the main body portion 222 and the fixing portion 24 cooperate to form a closed circle. Accordingly, the main body portion 222 can be used as a handle to hang the entire charging device 1, allowing the user to carry or store the charging device 1 by hanging the handle, and there is no need to provide an additional handle on the charging device 1.

Figure 6:
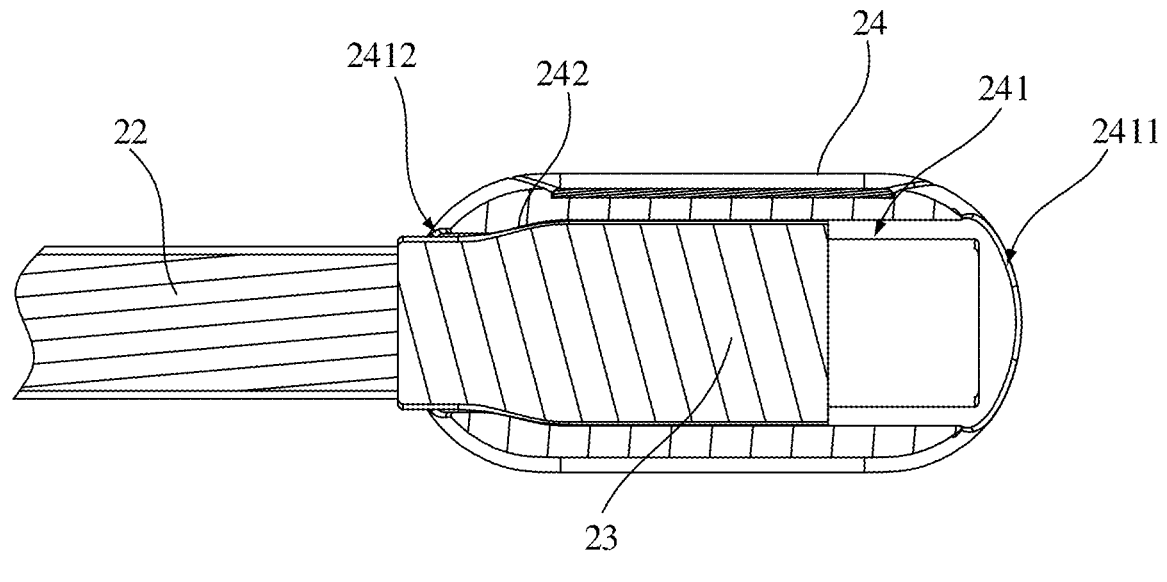
FIG. 6 is a cross-sectional view of a fixing portion and part of a conductive wire body according to an example of the present disclosure.

Further, referring to FIGS. 5 and 6, in some examples of the present disclosure, the fixing portion 24 has a fixing through groove 241 which is provided along an extension direction of the conductive wire body 22. The fixing through groove 241 has a first opening 2411 and a second opening 2412 on opposite ends thereof. The fixing through groove 241 is configured to accommodate the first connector 23. The first opening 2411 is configured for the first connector 23 to enter and exit the fixing through groove 241, and the second opening 2412 is configured for the conductive wire body 22 to enter and exit the fixing through groove 241. The first connector 23 and the conductive wire body 22 can both slide in the fixing through groove 241.

As illustrated in FIG. 6, a step structure 242 is provided on a side wall of the fixing through groove 241, is provided close to the second opening 2412, and is configured to lock with (e.g., secure, hold) the first connector 23, so that the first connector 23 and the fixing portion 24 are relatively fixed.

Specifically, the second opening 2412 may be formed by the step structure 242. The first connector 23 can enter and exit the fixing through groove 241 from the first opening 2411, and the first connector 23 is locked with the step structure 242 (e.g., the first connector 23 cannot pass through the second opening 2412), so a dimension of the first opening 2411 is larger than a dimension of the second opening 2412, and since the conductive wire body 22 can pass through the second opening 2412, the conductive wire body 22 can also pass through the first opening 2411.

In some examples, as illustrated in FIG. 5, the fixing through groove 241 has a third opening 2413 on a side away from the conductive wire body 22. The first opening 2411, the third opening 2413 and the second opening 2412 are arranged in sequence and are in communication. A width of the third opening 2413 is smaller than a width of the first connector 23 but greater than a width of the conductive wire body 22. The first connector 23 cannot enter and exit the fixing through groove 241 through the third opening 2413, while the conductive wire body 22 can enter and exit the fixing through groove 241 through the third opening 2413.

It can be understood that the first opening 2411 is close to the first end 221 of the conductive wire body 22, a first direction L1 is an extension direction from the second opening 2412 toward the first opening 2411, and a second direction L2 is opposite to the first direction, (e.g., the second direction L2 is an extension direction from the first opening 2411 toward the second opening 2412). When the user needs the first connector 23 (e.g., the first connector 23 needs to exit the fixing through groove 241), the first connector 23 is pushed along the first direction L1 until the first connector 23 completely exits the fixing through groove 241. At this time, the conductive wire body 22 is located in the fixing through groove 241, and the conductive wire body 22 can exit the fixing through groove 241 through the third opening 2413, so that the conductive wire body 22 can be stretched into a straight line, making it convenient for the user to use the conductive wire body 22 and the first connector 23. When the user has finished use (e.g., when the first connector 23 needs to be fixed into the fixing through groove 241), the conductive wire body 22 is placed into the fixing through groove 241 through the third opening 2413, and then the conductive wire body 22 is pulled along the second direction L2 until the first connector 23 completely enters the fixing through groove 241 through the first opening 2411. At this time, the first connector 23 is locked and fixed to the step structure 242, so that the conductive wire body 22 itself can enclose a closed circle which can serve as a handle.

Referring to FIG. 4, in some examples of the present disclosure, the second circuit assembly 30 further includes a mounting bracket 36 fixedly connected to the housing 10. The mounting bracket 36 has a mounting recess 361. The cable reel 31 is disposed in the mounting recess 361 and is rotatably connected to the mounting bracket 36. The mounting bracket 36 provides a mounting space and a placement base for the cable reel 31, and can limit the cable reel 31 to prevent the cable reel 31 from being displaced relative to the housing 10 during rotation, thereby facilitating stable contact between the conductive member 33 and the conductive track 211 on the first circuit board 21. The mounting bracket 36 may be fixedly connected to the housing 10 by screwing, locking, bonding, or the like, which is not specifically limited here.

Further, referring to FIG. 4, in some examples of the present disclosure, the second circuit assembly 30 further includes a coil spring 37, one end of which is connected to the cable reel 31, and the other end of which is connected to the mounting bracket 36. The coil spring 37 is wound along the circumference of the cable reel 31. It can be understood that when the charging cable 32 is pulled out under an external force, the charging cable 32 may drive the cable reel 31 to rotate relative to the mounting bracket 36 and the housing 10. At the same time, the cable reel 31 drives the coil spring 37 to rotate, so that the coil spring 37 is elastically deformed. After the external force is removed, the charging cable 32 and the cable reel 31 can rotate under the clastic force of the coil spring 37 to drive the cable reel 31 to rotate and be reset and wind the charging cable 32 around the circumference of the cable reel 31.

In some examples, the cable reel 31 includes a winding post, and is rotatably connected to the mounting bracket 36 via the winding post. The charging cable 32 and the coil spring 37 are both wound around the circumference of the winding post. The cable reel 31 is provided with a mounting groove configured to mount the coil spring 37. One end of the coil spring 37 is connected to the cable reel 31, and the other end of the coil spring 37 is connected to a side wall of the mounting groove. The coil spring 37 and the charging cable 32 are located on opposite sides of the cable reel 31, thereby reducing interference between the charging cable 32 and the coil spring 37 during rotation. The second circuit assembly 30 further includes a cover body which is connected to the cable reel 31 and closes the mounting groove to provide protection for mounting the coil spring 37.

Figure 7:
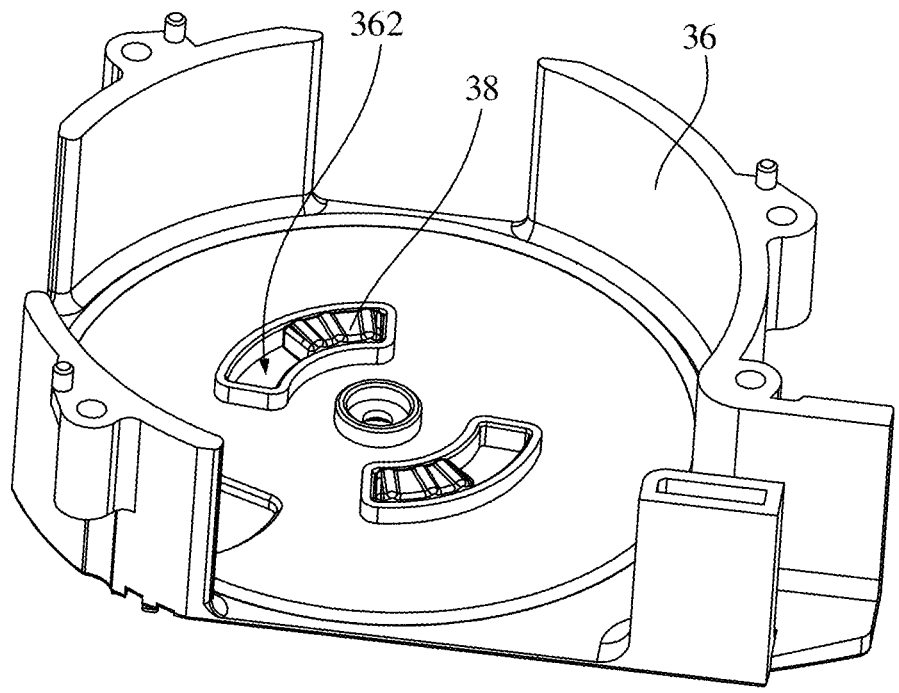
FIG. 7 is a structure diagram of a mounting bracket and a friction member according to an example of the present disclosure.

Referring to FIGS. 4 and 7, in some examples of the present disclosure, the second circuit assembly 30 further includes a friction member 38 that is located between the cable reel 31 and the mounting bracket 36. The friction member 38 is slidably connected to a first mating member, and abuts against a second mating member. The first mating member is one of the cable reel 31 and the mounting bracket 36, and the second mating member is the other of the cable reel 31 and the mounting bracket 36. Specific examples will be described in detail below.

The friction member 38 abuts against the second mating member. There may be a pressing force between the friction member 38 and the second mating member. Therefore, under an external pulling force, the charging cable 32 gradually extends from the accommodating cavity relative to the housing 10 and drives the cable reel 31 to rotate along a first rotation direction, and first frictional resistance occurs between the friction member 38 and the second mating member. When the charging cable 32 gradually retracts into the accommodating cavity relative to the housing 10 and drives the cable reel 31 to rotate along a second rotation direction, second frictional resistance occurs between the friction member 38 and the second mating member. The first rotation direction is opposite to the second rotation direction, and the first frictional resistance is smaller than the second frictional resistance. For example, the first rotation direction is one of a clockwise direction and a counterclockwise direction, and the second rotation direction is the other of the clockwise direction and the counterclockwise direction.

It can be understood that when the cable reel 31 rotates, frictional resistance occurs between the second mating member and the friction member 38, and can drive the friction member 38 to slide relative to the first mating member, thereby changing the frictional resistance between the second mating member and the friction member 38. For example, the second frictional resistance occurring when the charging cable 32 is retracted is greater than the first frictional resistance occurring when the charging cable 32 is extended, thereby making a speed of the charging cable 32 smaller during retraction. When the charging cable 32 is extended, the first frictional resistance between the cable reel 31 and the second mating member is small, thereby reducing an influence of the second mating member on rotation speeds of the cable reel 31 and the charging cable 32; when the charging cable 32 is retracted, the second frictional resistance between the cable reel 31 and the second mating member is large, thereby reducing the rotation speed of the cable reel 31 and reducing the retraction speed of the charging cable 32.

Figures 8A, 8B:
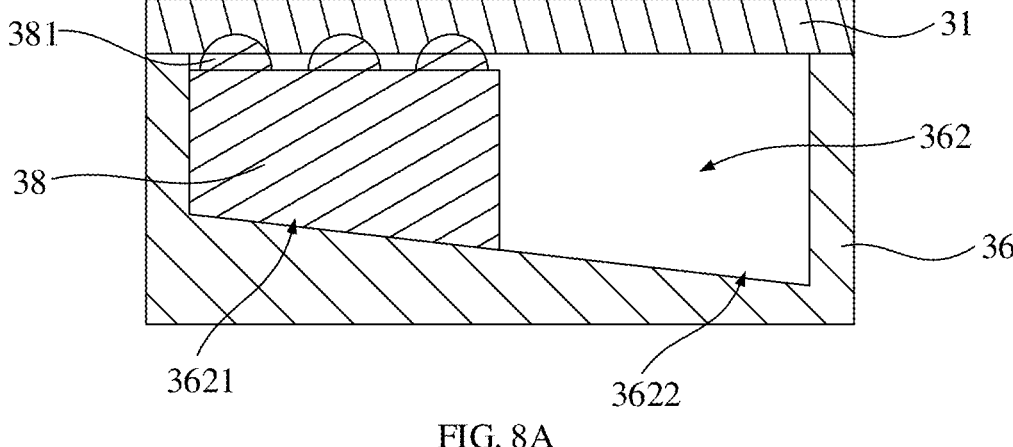
FIGS. 8A and 8B are structure diagrams of a friction member and part of a mounting bracket and a cable reel according to an example of the present disclosure.

Further, referring to FIGS. 7 and 8A-8B, in some examples of the present disclosure, the first mating member is the mounting bracket 36, and the second mating member is the cable reel 31 (e.g., the cable reel 31 and the mounting bracket 36 can be spaced apart). The friction member 38 is disposed on the mounting bracket 36 and abuts against the cable reel 31, and frictional resistance occurs between the cable reel 31 and the friction member 38 when the cable reel 31 rotates. A first slide groove 362 is provided on a side of the mounting bracket 36 facing the cable reel 31. The friction member 38 is located in the first slide groove 362 and can slide relative to the first slide groove 362. The friction member 38 abuts against the cable reel 31, and when the cable reel 31 rotates, the frictional resistance between the cable reel 31 and the friction member 38 drives the friction member 38 to slide in the first slide groove 362. The first slide groove 362 provides a mounting space for the friction member 38, and the friction member 38 slides in the first slide groove 362. The first slide groove 362 can limit a sliding distance and direction of the friction member 38, thereby reducing displacement and misalignment of the friction member 38 during sliding.

Furthermore, referring to FIG. 7, in some examples of the present disclosure, the first slide groove 362 extends along the first rotation direction of the cable reel 31, so that a sliding trajectory of the friction member 38 is coincident with the rotation direction of the cable reel 31. When the cable reel 31 rotates, the friction member 38 can better slide along the rotation direction of the cable reel 31 through the frictional resistance, which facilitates providing frictional resistance for rotation of the cable reel 31.

As illustrated in FIGS. 8A-8B, a bottom wall of the first slide groove 362 is provided oblique, and has a first end portion 3621 and a second end portion 3622 that are disposed opposite. Along an axial direction of the cable reel 31, a distance from the first end portion 3621 to the cable reel 31 is smaller than a distance from the second end portion 3622 to the cable reel 31. As illustrated in FIG. 8A, since the friction member 38 is closer to the cable reel 31 when the friction member 38 is located at the first end portion 3621 of the first slide groove 362, the interference between the friction member 38 and the cable reel 31 is large, the pressure between the friction member 38 and the cable reel 31 is large, and thus the frictional resistance between the friction member 38 and the cable reel 31 is large.

As illustrated in FIG. 8B, since the friction member 38 is farther from the cable reel 31 when the friction member 38 is located at the second end portion 3622 of the first slide groove 362, the interference between the friction member 38 and the cable reel 31 is small, the pressure between the friction member 38 and the cable reel 31 is small, and thus the frictional resistance between the friction member 38 and the cable reel 31 is small. In this example, the height of the friction member 38 in the first slide groove 362 is limited, so that the contact pressure between the friction member 38 and the cable reel 31 varies, which facilitates the friction member 38 to provide different frictional resistance in different rotation directions of the cable reel 31. Accordingly, it is convenient and labor-saving to pull the charging cable 32 out of the accommodating cavity, and it is safer to retract the charging cable 32.

For example, the friction member 38 is a silicone plug and is half in length of the length of the first slide groove 362. When the friction member 38 is located at the first end portion 3621 of the first slide groove 362, an interference distance between the friction member 38 and the cable reel 31 is 0.2 mm; when the friction member 38 is located at the second end portion 3622 of the first slide groove 362, the interference distance between the friction member 38 and the cable reel 31 is less than 0.05 mm.

In some examples, the mounting bracket 36 is provided with a plurality of first slide grooves 362 which are spaced apart around the circumference around the axis of the cable reel 31. Each of the plurality of first slide grooves 362 is provided with a friction member 38, thereby increasing the frictional resistance occurring between the friction member 38 and the cable reel 31 when the charging cable 32 retracts, and facilitating reducing speed of retraction of the charging cable 32.

In some examples, the first mating member is the cable reel 31 and the second mating member is the mounting bracket 36. The friction member 38 is slidably connected to the cable reel 31 and abuts against the mounting bracket 36. A second slide groove is provided on a side of the cable reel 31 facing the mounting bracket 36. The friction member 38 is located in the second slide groove and can slide relative to the second slide groove. The friction member 38 abuts against the mounting bracket 36. When the cable reel 31 rotates, the friction member 38 slides in the second slide groove due to frictional resistance between the friction member 38 and the mounting bracket 36.

In some examples of the present disclosure, as illustrated in FIG. 8, a plurality of protrusions 381 are provided on a surface of the friction member 38 facing the second mating member. The plurality of protrusions 381 are arranged along the first rotation direction of the cable reel 31, and abut against the second mating member. The plurality of protrusions 381 are arranged at intervals and are arc-shaped. The plurality of protrusions 381 form a wavy friction surface, which facilitates increasing the frictional resistance between the friction member 38 and the second mating member, and is convenient for the cable reel 31 to drive the friction member 38 to slide on the first mating member when the cable reel 31 rotates. For example, taking the second mating member as the cable reel 31 and the first mating member as the mounting bracket 36 as examples, the protrusions 381 are located on the surface of the friction member 38 facing the cable reel 31 and abut against the cable reel 31. In an example, when the cable reel 31 drives the first circuit board 21 and the conductive member 33 to rotate, the conductive member 33 can move along the conductive track 211 on the first circuit board 21, thereby always contacting the conductive track 211 and conducting electricity, so that the charging cable 32 can supply power to external electronic devices more stably. Besides, the first end 221 and the second end 223 of the conductive wire body 22 are relatively fixed, and the main body portion 222 of the conductive wire body 22 may enclose (e.g., form) a closed circle (e.g., loop), so that the main body portion 222 can be used as a handle to hang the entire charging device 1. The main body portion 222 of the conductive wire body, the connector 23, and the fixing portion 24 may together form a closed circle (e.g., loop). Accordingly, the user is allowed to carry or store the charging device 1 by hanging the handle, and there is no need to provide an additional handle on the charging device 1. In addition, since the friction member 38 is provided between the mounting bracket 36 and the cable reel 31, the friction member 38 provides frictional resistance for the rotation of the cable reel 31. By limiting the height of the friction member 38 in the slide groove, the interference between the friction member 38 and the second mating member varies, which facilitates the friction member 38 to provide different frictional resistance in different rotation directions of the cable reel 31. When the charging cable 32 retracts, the second frictional resistance between the friction member 38 and the second mating member is large, thereby reducing the retraction speed of the charging cable 32 and improving the storage safety of the charging cable 32.

In an example of the present disclosure, high-power portable power supplies (e.g., power banks) are portable power supply devices with high energy densities and high output powers. The high-power portable power supplies can provide continuous and stable power supply for various mobile devices, such as smart phones, tablets, laptops, etc. With the rapid development of technologies of the high-power portable power supplies, the power densities of the high-power portable power supplies continue to increase, and the amount of the heat generated by battery cells and power components inside the portable power supplies also increases.

The portable power supplies are frequently used by users, and users pay attention to the temperatures of the housings and temperatures of internal components of the portable power supplies. In the related art, to improve the heat dissipation capacity of the portable power supplies, power supply bodies are usually encapsulated with potting materials, in order to achieve thermal equalization and effective heat dissipation of the battery cells and the power components. Inventors of the present disclosure have found that, although this thermal management scheme can alleviate the temperature rising of the housings to a certain extent, it compromises the maintainability of the portable power supplies. Besides, the addition of the potting materials increases the overall weights of the portable power supplies, which is not conducive to portability designs and light-weight trends of the portable power supplies.

Figure 9:
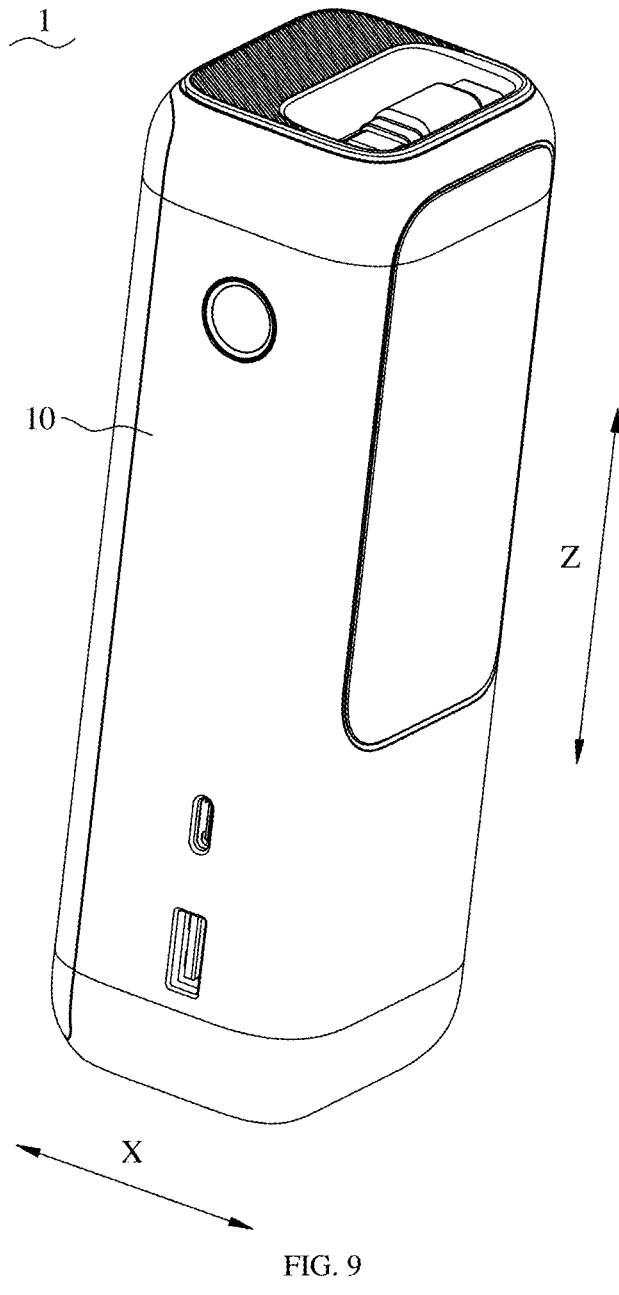
FIG. 9 is a schematic structural view of a portable power supply according to an example of the present disclosure.
Figures 10, 11:
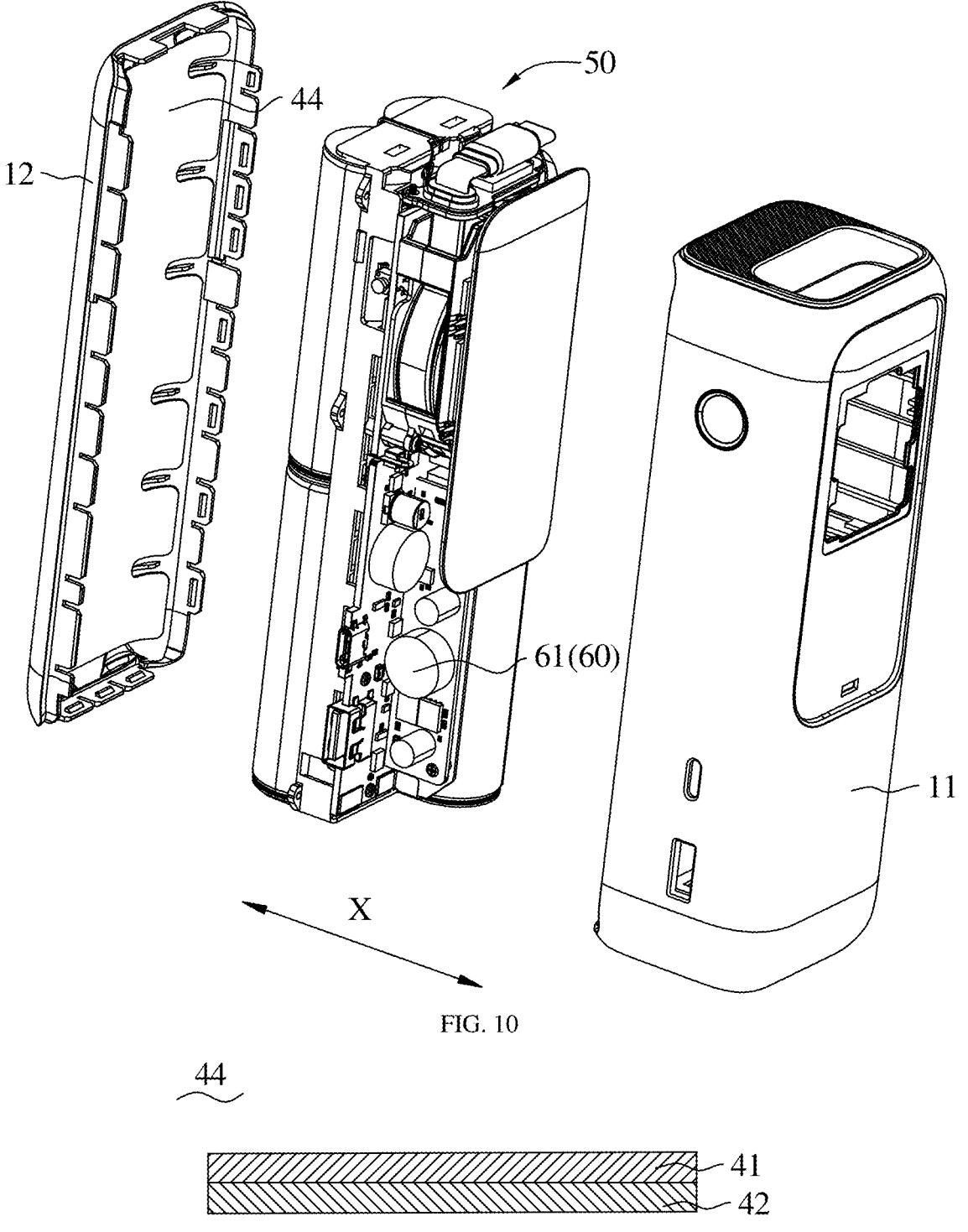
FIG. 10 is a schematic exploded structural view of the portable power supply according to an example of the present disclosure.
FIG. 11 is a schematic structural view of a thermal insulation member according to an example of the present disclosure.

In view of the above problems existing in the related art, the present disclosure describes a charging device (e.g., the charging device 1). As shown in FIGS. 9-11, the charging device 1 may include the housing 10, a power supply body 50, a thermal conduction member 60, and a thermal insulation member 44. The housing 10 may define an accommodating cavity. The power supply body 50 may be arranged in the accommodating cavity. The thermal insulation member 44 may be arranged in the accommodating cavity and located outside the power supply body 50. The thermal insulation member 44 may include a thermal equalization layer 41 and a thermal insulation layer 42. The thermal equalization layer 41 may be arranged on an inner wall surface of the housing 10. The thermal insulation layer 42 may be arranged on a side of the thermal equalization layer 41 facing the power supply body 50. The power supply body 50 may include a battery cell 23 and a power component. The thermal insulation layer 42 may be configured to increase thermal resistances between the thermal equalization layer 41 and the battery cell 53 and between the thermal equalization layer 41 and the power component, and reduce the amount of the heat dissipated by the battery cell 53 and the power component to the thermal equalization layer 41. In this way, the temperature of the housing 10 may be reduced. The thermal equalization layer 41 may be configured to uniformly transfer the received heat to the housing 10, which realizes effective distribution and release of the heat, reduces the formation of local hot spots in the housing 10, and further reduces the temperature of the housing 10. Thus, the temperature distribution of the housing 10 during the operation of the high-power portable power supply may be improved.

Compared with the traditional potting process, in some examples of the present disclosure, the thermal insulation member 44 may be used as a thermal conduction structure, and the thermal insulation member 44 may be arranged on the inner wall surface of the housing 10, rather than being closely attached to the power supply body 50. In this way, the influence of the thermal conduction structure on the disassembly and assembly of the power supply body 50 may be reduced, the power supply body 50 may be more easily removed from or installed in the housing 10, and the maintainability and maintenance efficiency of the charging device 1 may be improved. Compared with the potting material such as a thermal-conductive potting adhesive, the thermal insulation member 44 may have a lighter weight, which can reduce the overall weight of the charging device 1.

The structure of the charging device 1 according to some examples of the present disclosure will be described in detail below with reference to the drawings.

Figure 12:
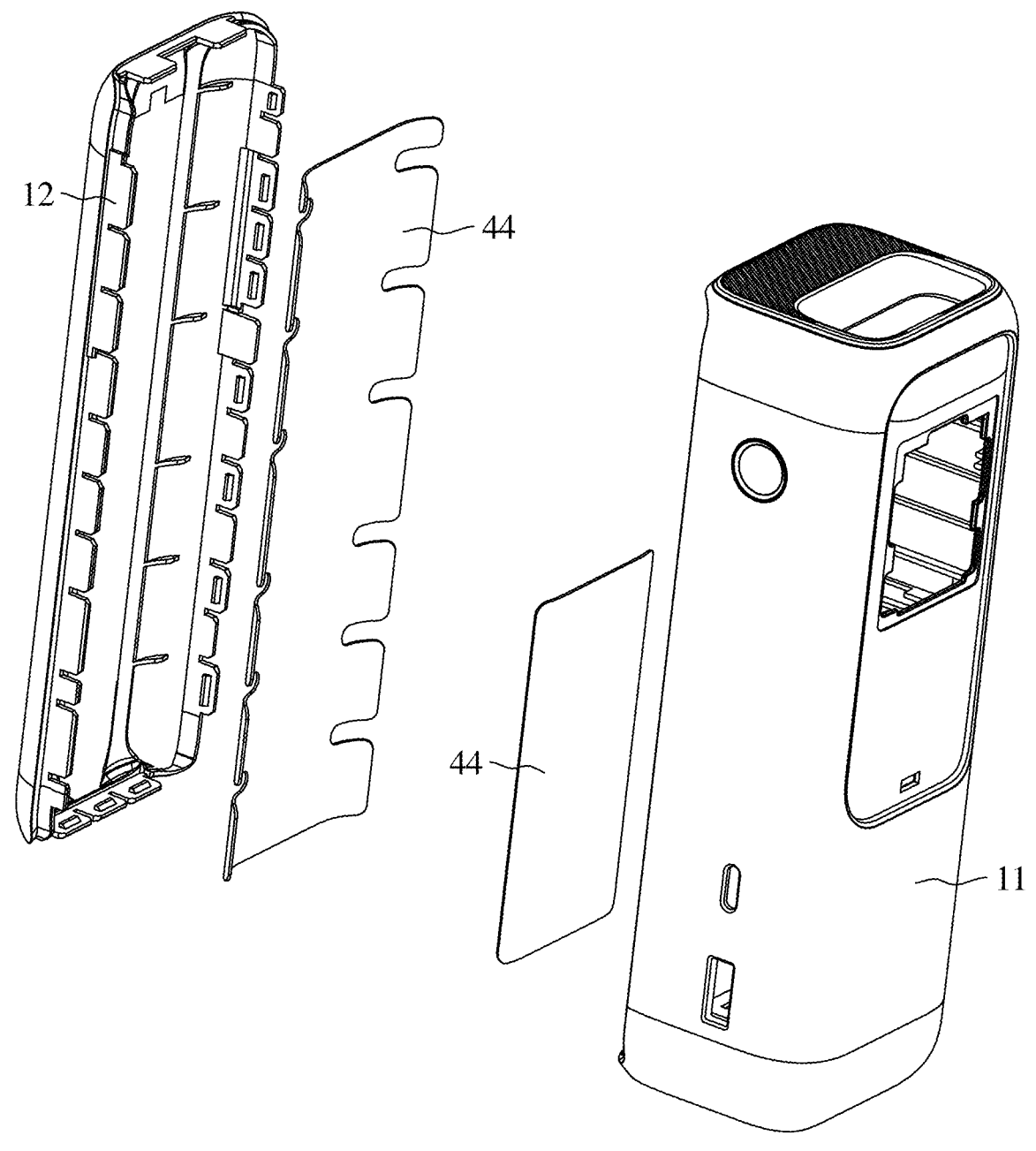
FIG. 12 is a schematic structural view illustrating a mounting structure of a housing and the thermal insulation member according to an example of the present disclosure.
Figure 13:
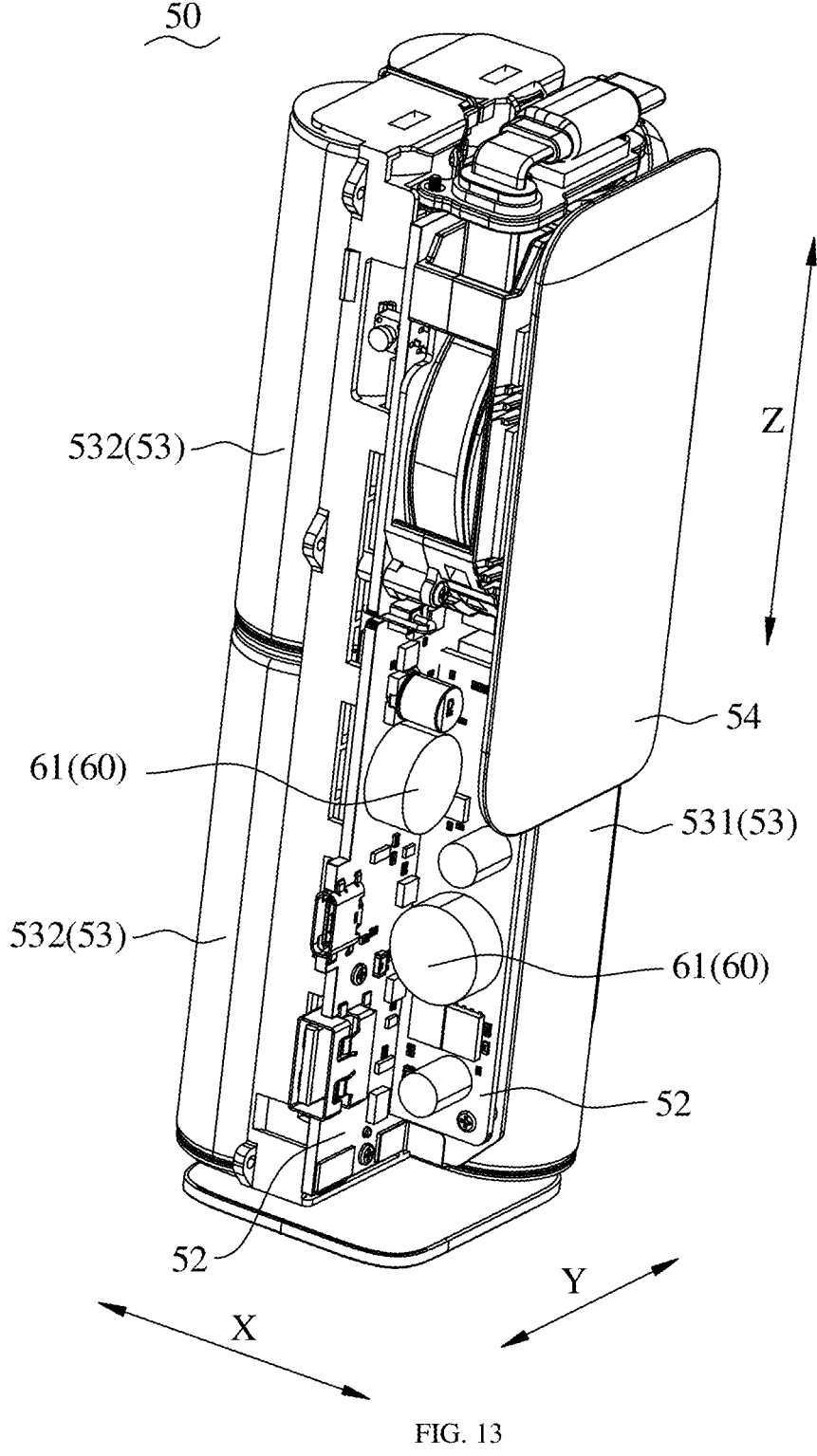
FIG. 13 is a schematic structural view of a power supply body according to an example of the present disclosure.

FIG. 12 is a schematic structural view illustrating a mounting structure of the housing 10 and the thermal insulation member 44 according to some examples of the present disclosure. In some examples of the present disclosure, as shown in FIG. 13, a height-extension direction of the housing 10 may be taken as a first direction X, a width-extension direction of the housing 10 may be taken as a second direction Y, and a length-extension direction of the housing 10 may be taken as a third direction Z. In some examples, the housing 10 may include a bottom shell 11 and a top shell 12 (e.g., a surface shell, an upper shell). The top shell 12 may cover the bottom shell 11 along the first direction X. The top shell 12 may be detachably mounted on the bottom shell 11 to facilitate the disassembly and the assembly of the charging device 1. The bottom shell 11 and the top shell 12 may cooperatively define or enclose to define the accommodating cavity. The power supply body 50 may be mounted on the bottom shell 11.

In the thermal insulation member 40, the thermal equalization layer 41 may be made of a material with a high thermal conductivity to rapidly and uniformly disperse or dissipate the received heat, so as to reduce the formation of the local hot spots in the housing 10. In some examples, the thermal equalization layer 41 may include at least one of a graphene thermal equalization layer, a graphene-polymer composite thermal equalization layer, or a graphene-based metal composite thermal equalization layer. The thermal insulation layer 42 may be made of a material with a low thermal conductivity to reduce the heat transfer and block the heat generated by the battery cell and the power component from being further dissipated or transferred to the thermal equalization layer 41. In some examples, the thermal insulation layer 42 may include at least one of an aerogel thermal insulation layer and an aluminum-foil thermal insulation layer.

In some examples, the thermal insulation member 44 may include an aerogel-graphene composite material. The aerogel-composite graphene material may have a thermal conductivity of 0.018 W (m/K) and a thermal resistance of 0.45 m2 (m·K). Compared with the traditional thermal insulation material, the aerogel may have an extremely low thermal conductivity, and may achieve the same or even better thermal insulation effect with a smaller thickness.

In some implementations, the charging device 1 may include two thermal insulation members 44. The two thermal insulation members 44 may be located on two opposite sides of the power supply body 50 in the first direction X, respectively. The two thermal insulation members 44 may be arranged on the two inner wall surfaces of the housing 10 which are arranged oppositely to each other in the first direction X. It should be noted that, the heat generated by the battery cell 53 and the power component may be mainly transferred outward from the two opposite sides of the power supply body 50 in the first direction X. Therefore, based on the heat flow direction inside the charging device 1, the heat transferred from the battery cell 53 and the power component to the housing 10 may be reduced by disposing the thermal insulation member 44 on the heat transfer path, thereby reducing the surface temperature of the housing 10.

Furthermore, one of the two thermal insulation members 44 may be mounted on the bottom shell 11, and the other of the two thermal insulation members 44 may be mounted on the top shell 12. The power supply body 50 may be mounted on the bottom shell 11. After the top shell 12 covers on the bottom shell 11 along the first direction X, the two thermal insulation members 44 may be arranged on the two opposite sides of the power supply body 50 in the first direction X. The power supply body 50 may be fixed inside the housing 10. The top shell 12 may further include a plurality of abutting portions. A plurality of avoidance holes, which correspond to the plurality of abutting portions, may be defined or formed in the thermal insulation member 44 mounted on the top shell 12. Each of the plurality of abutting portions may pass through a corresponding one of the plurality of avoidance holes and extend towards the power supply body 50 along the first direction X. The plurality of abutting portions may abut against the power supply body 50 after the top shell 12 covers on the bottom shell 11, in order to maintain the position of the power supply body 50 in the first direction X relative to the housing 10.

FIG. 13 is a schematic structural view of the power supply body 50 according to some examples of the present disclosure. The power supply body 50 may further include a mounting member 51 and a circuit board 52. The mounting member 51 may be mounted on the bottom shell 11. The circuit board 52 may be arranged on the mounting member 51. The power supply body 50 may include a plurality of power components. The circuit board 52 may be mounted on the mounting member 51 while avoiding the battery cell 23. When the charging device 1 is in use, both the battery cell 53 and the plurality of power components generate heat. In some examples, all the power components may be arranged on the circuit board 52. Due to the difference in power density between different power components, hot spots may occur on the circuit board 52. In some examples of the present disclosure, the thermal insulation member 44 may cover the battery cell 53 and/or the power component, to insulate the heat generated by the battery cell 53 and/or the power component, reduce the heat flow density at the hot spot, and lower the temperature of the hot spot of the housing 10. It should be noted that a fitting clearance may be formed between the thermal insulation member 44 and the battery cell 53, and between the thermal insulation member 44 and the power component, so that the power supply body 50 is able to be mounted in the housing 10.

In some examples of the present disclosure, the heat may be dissipated from the power supply body 50 through the thermal conduction member 60. Based on the requirement of thermal dissipation, the thermal conduction member 60 may be a thermal conduction adhesive, a thermal conduction block, a thermal conduction paste or mud, a metal thermal conduction member, etc.

When the battery cell 53 in the power supply body 50 generates a large amount of heat, the thermal conduction member 60 may be individually or separately arranged correspondingly to the battery cell 53, to disperse the heat generated by the battery cell 53 to an area outside the battery cell 53, so as to effectively reduce the working temperature of the battery cell 53 and reduce performance degradation or damage caused by overheating.

In some examples, when the power component in the power supply body 50 generates a large amount of heat, the thermal conduction member 60 may be individually or separately arranged correspondingly to the power component, so as to disperse the heat generated by the power component (such as a switching tube, a rectifier, etc.) to an area outside the power component, thereby keeping the power component operating at a lower working temperature and improving conversion efficiency and stability of the charging device 1 as a whole.

In some other examples, a plurality of thermal conduction members 60 may be included. In some examples, at least one of the plurality of thermal conduction members 60 may be arranged correspondingly to the battery cell 53, and another at least one of the plurality of thermal conduction members 60 may be arranged correspondingly to the high-power component, so that the heat generated by the battery cell 53 and the power component may be conducted to other areas of the power supply body 50 via the plurality of thermal conduction members 60, and the heat generated in the power supply body 50 may be internally equalized by the plurality of thermal conduction members 60. Additionally or alternatively, the heat generated by the battery cell 53 and the power component may be conducted into the accommodating cavity via the plurality of thermal conduction members 60, so that the heat generated in the power supply body 50 may be dispersed by the plurality of thermal conduction members 60.

The present disclosure may be further described by taking an example of arranging the thermal conduction member 60 correspondingly to the battery cell 53 and/or the power component.

Figure 14:
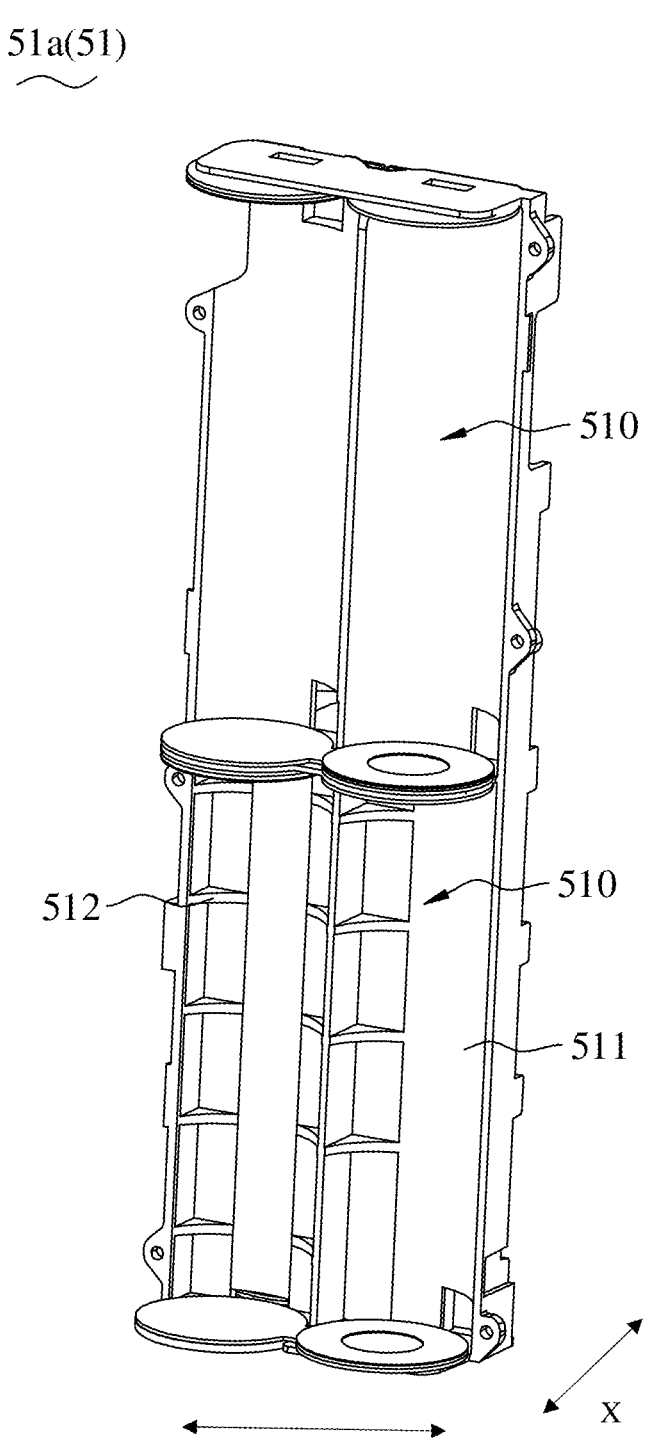
FIG. 14 is a schematic structural view of a battery cell bracket according to an example of the present disclosure.

As shown in FIG. 13 and FIG. 14, in some examples of the present disclosure, the power supply body 50 may include a plurality of battery cells 53. The mounting member 51 may be a battery cell bracket 51a. The battery cell bracket 51a may define a plurality of cell grooves 510 on two opposite sides of the battery cell bracket 51a along the first direction X. The plurality of battery cells 53 may be mounted to the battery cell bracket 51a and arranged in the plurality of cell grooves 510 in one-to-one correspondence. The plurality of battery cells 53 may be divided into two groups. One group of battery cells 53 forms a first cell unit 531, and the other group of battery cells 53 forms a second cell unit 532 (e.g., 4 battery cells). The first cell unit 531 and the second cell unit 532 may be stacked on one another in the first direction X (e.g., arranged side by side). The first direction X may be the direction in which the first cell unit 531 and the second cell unit 532 are stacked (e.g., the height-extension direction of the housing 10).

Furthermore, the circuit board 52 and the first cell unit 531 may be arranged side by side in the second direction Y, and the circuit board 52 and the second cell unit 532 may be stacked in the first direction X. The second direction Y may be substantially perpendicular to the first direction X (e.g., the second direction Y may be the width-extension direction of the housing 10).

The plurality of battery cells 53 and the plurality of power components on the circuit board 52 may be arranged on two opposite sides of the battery cell bracket 51a along the first direction X, and the heat generated by the plurality of battery cells 53 and the plurality of power components may be mainly transferred outward from the two opposite sides of the power supply body 50 along the first direction X. In this way, it is possible to regulate the heat flow direction in the charging device 1, which facilitates the targeted arrangement of the thermal insulation member 44 in the heat flow direction. Thus, an effect of improving the temperature distribution of the housing 10 may be achieved.

It may be understood that the battery cell 53, as an energy storage unit of the charging device 1, may generate a large amount of heat during charging and discharging. In order to reduce the occurrence of the battery cell 53 working at an excessive temperature, in some examples of the present disclosure, the thermal conduction member 60 may further include a thermal conduction adhesive. The thermal conduction adhesive may be a silicone compound with organic silicone as the main component, mixed with fillers, thermal conduction materials, and other polymeric materials. The thermal conduction adhesive may not only have good thermal conduction and electrical insulation properties, but also have a good bonding strength. The connection reliability between the battery cell 53 and the battery cell bracket 51*a* may be effectively enhanced. The battery cell bracket 51*a* may include a bracket body 511. The bracket body 511 may define a plurality of cell grooves 510. Each of the plurality of battery cells 53 may be mounted in a corresponding one of the plurality of cell grooves 510, and a gap space may be formed between each of the plurality of battery cells 53 and the bracket body 511. The gap space may be filled with a thermal conduction adhesive. The thermal conduction adhesive may be attached to and in contact with a side surface of the battery cell 53, and further attached to and in contact with the battery cell bracket 51*a*. The thermal conduction adhesive may be configured to guide the heat generated by the battery cell 53 to the battery cell bracket 51*a*.

As further shown in FIG. 13 and FIG. 14, the battery cell bracket 51*a* may further include a plurality of grid plates 512 connected to the bracket body 511. The plurality of grid plates 512 may be arranged in the gap space at intervals along the third direction Z. The thermal conduction adhesive may be filled between the plurality of grid plates 512, so that the thermal conduction adhesive may be uniformly filled in the gap space along the third direction Z. The plurality of grid plates 512 may also be configured to block the thermal conduction adhesive, so as to reduce the occurrence of uneven heat dissipation of the battery cell 53 caused by the flowing of the thermal conduction adhesive before curing. The third direction Z, the first direction X, and the second direction Y may be perpendicular to each other. In some examples of the present disclosure, the third direction Z may be the length-extension direction of the housing 10.

In some other examples of the present disclosure, the power supply body 50 may include one battery cell 53. The mounting member 51 may be a mounting base and configured to provide an arrangement base for the battery cell 53. In order to reduce the occurrence of the battery cell 53 working at an excessive temperature, the thermal conduction member 60 may further include a thermal conduction adhesive. The battery cell 53 may be mounted on the mounting base. The thermal conduction adhesive may be filled in a gap between the battery cell 53 and the mounting base. The thermal conduction adhesive may be attached to and in contact with a side surface of the battery cell 53 and attached to and in contact with the mounting base. The thermal conduction adhesive may be configured to not only guide the heat generated by the battery cell 53 to the mounting base, but also effectively enhance the connection reliability between the battery cell 53 and the mounting base.

In some examples of the present disclosure, the number of the circuit boards 52 may be two. One of the two circuit boards 52 may be a first circuit board, the other of the two circuit boards 52 may be a second circuit board. The board surface of the first circuit board may be perpendicular to the board surface of the second circuit board, the board surface of the first circuit board may be perpendicular to the first direction X, and the second circuit board may be located on a side of the first circuit board facing the first cell unit. The surface of at least one of the first circuit board and the second circuit board facing away from the battery cell 53 may be arranged or configured with a power component. Compared with the scheme in which one circuit board extending along the second direction Y is used, in some examples of the present disclosure, the two circuit boards 52 with surfaces perpendicular to each other may be used, which facilitates reducing the width occupied by the two circuit boards 52 in the second direction Y, reserving more installation space for the battery cell 53, and improving the capacitance of the charging device 1.

The thermal conduction member 60 may include a thermal conduction block 61 and a thermal conduction paste or mud (not shown). The thermal conduction block 61 may be arranged on the power component and configured to dissipate the heat generated by the power component to the accommodating cavity. In some implementations, the thermal conduction block 61 may be installed on the circuit board 52 and corresponding to the power component. In order to reduce the thermal resistance, the thermal conduction paste may be filled between the thermal conduction block 61 and the power component. The thermal conduction paste may be a muddy thermal conduction material composed of a silicone base filled with a plurality of high-performance ceramic powders. As a non-curing and low-stress thermal interface material, the thermal conduction paste is capable of filling the gap between the thermal conduction block 61 and the power component, which enhances the thermal conduction efficiency and ensures that the heat generated by the power component is fully transferred to the thermal conduction block 61 through the thermal conduction paste. In this way, in some examples of the present disclosure, the heat of the power component arranged on the circuit board 52 may be conducted out through the thermal conduction paste and the thermal conduction block 61, thereby equalizing the heat on the surface of the circuit board 52.

The power supply body 50 may further include a display assembly 54. The display assembly 54 and the first cell unit 531 may be arranged on the same side of the second cell unit 532. The display assembly 54 may be arranged on the same side of the first cell unit 531 and the circuit board 52 in the third direction Z. The first direction X, the second direction Y, and the third direction Z may be perpendicular to each other. It may be understood that, the display assembly 54 generates less heat, and there is no need to arrange a thermal conduction structure for the display assembly 54. In the third direction Z, the thermal insulation member 44 may be arranged to avoid the display assembly 54. In some implementations, the housing 10 may define a display opening corresponding to the display assembly 54. The thermal insulation member 44 may be arranged on a side of the display opening in the third direction Z. At least a portion of the thermal insulation member 44 corresponds to the first cell unit 531.

In some examples of the present disclosure, at least a portion of the thermal insulation member 44 may be arranged on a side of the first cell unit 531 away from the second cell unit 532 in the first direction X, and the at least a portion of the thermal insulation member 44 covers the first cell unit 531 and the circuit board 52 in the first direction X and is arranged to avoid the display assembly 54. The heat generated by the first cell unit 531 and the power component on the circuit board 52 may be insulated and equalized, thereby reducing the surface temperature of the housing 10. In some examples, in the first direction X, at least another portion of the thermal insulation member 44 may be arranged on a side of the second cell unit 532 away from the first cell unit 531 and cover the second cell unit 532 in the first direction X, so as to insulate and equalize the heat generated by the second cell unit 532, thereby reducing the surface temperature of the housing 10.

The same or similar reference numerals in the drawings of the example correspond to the same or similar components. In the description of the present disclosure, it should be understood that if the terms "up", "down", "left", "right", and the like indicate directions or positional relationships based on the directions or positional relationships shown in the drawings, it is only for the convenience of describing the disclosure and simplifying the description, and does not indicate or imply that the device or element referred to must have a specific direction, be constructed and operated in a specific direction. Therefore, the terms describing the positional relationship in the drawings are only used for illustrative purposes and cannot be understood as limitations on the present disclosure. For those of ordinary skill in the art, the specific meanings of the above terms can be understood according to specific circumstances.

The above are only examples of the present disclosure and are not intended to limit the present disclosure. Any modifications, equivalent substitutions and improvements made within the spirit and principles of the present disclosure should be included in the protection scope of the present disclosure.

What is claimed is:

1. A charging device comprising:
a housing having an accommodating cavity;
a retractable charging cable at least partially located within the accommodating cavity;
a second charging cable having a first end extending into the accommodating cavity and a second end located outside the accommodating cavity;
a connector electrically connected to the second end of the second charging cable; and
a fixing portion disposed on the second charging cable, wherein the connector is configured to be retained in the fixing portion, and wherein the second charging cable, the connector, and the fixing portion together form a closed loop.

2. The charging device of claim 1, further comprising:
a conductive track disposed within the accommodating cavity;
a cable reel disposed within the accommodating cavity; and
a conductive member disposed on the cable reel and in electrical contact with the conductive track.

3. The charging device of claim 2, wherein:
the conductive track is circular,
the conductive member comprises a plurality of conductive elastic sheets arranged at intervals around an axis of the cable reel, and
the plurality of conductive elastic sheets is in electrical contact with the conductive track.

4. The charging device of claim 2, wherein the retractable charging cable is electrically connected to the conductive member and wound around a circumference of the cable reel, and the conductive member is in electrical contact with the conductive track during rotation of the cable reel and the conductive member.

5. The charging device of claim 1, wherein:
the retractable charging cable is configured to extend from the accommodating cavity, and
the connector is detachably coupled to the fixing portion.

6. The charging device of claim 1, wherein the fixing portion comprises a through groove having a first opening and a second opening on opposite ends of the through groove, and
the through groove comprises a step structure configured to secure the connector.

7. The charging device of claim 6, wherein the through groove comprises a third opening between the first opening and the second opening, wherein a width of the third opening is smaller than a width of the connector.

8. A charging device comprising:
a housing having an accommodating cavity;
a retractable charging cable at least partially located within the accommodating cavity;
a second charging cable having a first end extending into the accommodating cavity and a second end located outside the accommodating cavity;
a connector electrically connected to the second end of the second charging cable; and
a fixing portion disposed on the second charging cable, wherein:
the fixing portion comprises a through groove having a first opening and a second opening on opposite ends of the through groove, and
the through groove comprises a step structure configured to secure the connector.

9. The charging device of claim 1, wherein the connector is configured to pass through the fixing portion, the second charging cable, the connector, and the fixing portion together forming a closed loop.

10. The charging device of claim 1, further comprising:
a battery cell disposed within the accommodating cavity;
a first circuit board disposed within the accommodating cavity; and
a second circuit board disposed within the accommodating cavity, the second circuit board being oriented substantially perpendicular to the first circuit board and facing the battery cell.

11. The charging device of claim 10, wherein:
the retractable charging cable extends into the accommodating cavity and is electrically connected to at least one of the first circuit board or the second circuit board, and
the second charging cable is electrically connected to the connector.

12. The charging device of claim 8, wherein the connector is detachably coupled to the fixing portion.

13. The charging device of claim 8, further comprising:
a battery cell bracket;
a first subset of a plurality of battery cells on the battery cell bracket; and
a second subset of the plurality of battery cells on the battery cell bracket, wherein the battery cell bracket comprises a plurality of grid plates.

14. A charging device comprising:
a housing having an accommodating cavity;
a battery cell disposed within the accommodating cavity;
a retractable charging cable at least partially located in the accommodating cavity;
a first circuit board disposed within the accommodating cavity;
a second circuit board disposed within the accommodating cavity, the second circuit board being oriented substantially perpendicular to the first circuit board and facing the battery cell;
a second charging cable; and
a connector, wherein:

a first end of the second charging cable extends into the accommodating cavity and is electrically connected to at least one of the first circuit board or the second circuit board, and a second end of the second charging cable is electrically connected to the connector.

15. The charging device of claim 14, further comprising:

a battery cell bracket;

a first subset of a plurality of battery cells on the battery cell bracket; and a second subset of the plurality of battery cells on the battery cell bracket.

16. The charging device of claim 15, further comprising:

a display disposed within the accommodating cavity, wherein the display and the first subset of the plurality of battery cells are arranged on a same side of the second subset of the plurality of battery cells.

17. The charging device of claim 14, further comprising:

a battery cell bracket comprising a plurality of cell grooves configured to hold a plurality of battery cells comprising the battery cell.

18. The charging device of claim 14, further comprising:

a fixing portion disposed on the second charging cable, wherein:

the connector is configured to pass through the fixing portion, the second charging cable, the connector, and the fixing portion together forming a closed loop.

19. The charging device of claim 14, further comprising:

a fixing portion disposed on the second charging cable, wherein:

the fixing portion comprises a through groove having a first opening and a second opening on opposite ends of the through groove, and the through groove comprises a step structure configured to secure the connector.

20. The charging device of claim 14, further comprising:

a first subset of a plurality of battery cells comprising at least two battery cells; and a second subset of a plurality of battery cells arranged side by side of the first subset of a plurality of battery cells.

* * * * *